US012787477B2

(12) United States Patent
Ackert et al.

(10) Patent No.: US 12,787,477 B2
(45) Date of Patent: Nov. 3, 2026

(54) HIGH POWER PHOTODIODE

(71) Applicant: Lumentum Technology (UK) Limited, Northamptonshire (GB)

(72) Inventors: Jason Ackert, Ottawa (CA); Chengkun Chen, Ottawa (CA); Marcel G. Boudreau, Ottawa (CA)

(73) Assignee: Lumentum Technology UK Limited, Northamptonshire (GB)

( * ) Notice: Subject to any disclaimer, the term of this patent is extended or adjusted under 35 U.S.C. 154(b) by 396 days.

(21) Appl. No.: 18/525,407

(22) Filed: Nov. 30, 2023

(65) Prior Publication Data

US 2025/0081662 A1 Mar. 6, 2025

Related U.S. Application Data

(60) Provisional application No. 63/535,879, filed on Aug. 31, 2023.

(51) Int. Cl.
*H01L 31/18* (2006.01)
*H10F 71/00* (2025.01)
*H10F 77/1223* (2025.01)

(52) U.S. Cl.
CPC ..... *H10F 77/1223* (2025.01); *H10F 71/1215* (2025.01)

(58) Field of Classification Search
CPC ............. H10F 77/1223; H10F 71/1215; G02B 6/12004
See application file for complete search history.

(56) References Cited

U.S. PATENT DOCUMENTS

| | | | | |
|---|---|---|---|---|
| 7,043,124 | B2 * | 5/2006 | Salib | G02B 6/1228 385/129 |
| 9,287,432 | B2 | 3/2016 | Shi et al. | |
| 12,166,141 | B2 * | 12/2024 | Santangelo | H10D 62/107 |
| 2010/0148221 | A1 * | 6/2010 | Yu | B82Y 20/00 257/225 |
| 2016/0380023 | A1 * | 12/2016 | Yoneda | G02B 6/12004 257/432 |
| 2018/0102442 | A1 * | 4/2018 | Wang | G02B 1/002 |
| 2019/0288132 | A1 * | 9/2019 | Wang | G02B 1/002 |

OTHER PUBLICATIONS

Lee et al., "An Equivalent Circuit Model for a Ge Waveguide Photodetector on Si," IEEE Photonics Technology Letters, vol. 28, No. 21, Nov. 1, 2016, 4 pages.
Jiang et al., "High-power Si-Ge photodiode assisted by doping regulation," Optics Express, vol. 29, No. 5, Mar. 2, 2021, 9 pages.

* cited by examiner

*Primary Examiner* — Thao P Le
(74) *Attorney, Agent, or Firm* — Harrity & Harrity, LLP

(57) ABSTRACT

In some implementations, a photodiode includes a waveguide layer of a first semiconductor material. The photodiode may include a first ion-implantation region, in the first semiconductor material, that is doped to exhibit a first conductivity type. The photodiode may include a mesa, of a second semiconductor material, on the waveguide layer. The first ion-implantation region may be set back from a section of an edge of a bottom surface of the mesa. The photodiode may include a second ion-implantation region, in the second semiconductor material, that is doped to exhibit a second conductivity type. The second ion-implantation region may extend from a top surface of the mesa, down a portion of a sloped sidewall of the mesa, and to the edge of the bottom surface of the mesa.

20 Claims, 4 Drawing Sheets

HIGH POWER PHOTODIODE

CROSS-REFERENCE TO RELATED APPLICATION

This Patent Application claims priority to U.S. Provisional Patent Application No. 63/535,879, filed on Aug. 31, 2023, and entitled "HIGH POWER PHOTODIODE." The disclosure of the prior Application is considered part of and is incorporated by reference into this Patent Application.

TECHNICAL FIELD

The present disclosure relates generally to photodiodes and to a high power photodiode.

BACKGROUND

Coherent optical communication uses modulation of the amplitude and phase of light, as well as transmission across two polarizations, to enable high-speed and long-distance optical communication. In coherent optical communication, coherent modulation is used at a transmitting end, and coherent technology is used at a receiving end for detection (e.g., using an optical heterodyne architecture).

SUMMARY

In some implementations, a photodiode includes a waveguide layer of a first semiconductor material. The photodiode may include a first ion-implantation region, in the first semiconductor material, that is doped to exhibit a first conductivity type. The photodiode may include a mesa, of a second semiconductor material, on the waveguide layer. The mesa may have a bottom surface that is over the first ion-implantation region, a top surface that is opposite the bottom surface, and a sloped sidewall between the bottom surface and the top surface. The first ion-implantation region may be set back from a section of an edge of the bottom surface of the mesa. The waveguide layer may optically couple to an optical input portion of the sloped sidewall of the mesa. The photodiode may include a second ion-implantation region, in the second semiconductor material, that is doped to exhibit a second conductivity type. The second ion-implantation region may extend from the top surface of the mesa to the optical input portion of the sloped sidewall of the mesa.

In some implementations, a photodiode includes a waveguide layer of a first semiconductor material. The photodiode may include a first ion-implantation region, in the first semiconductor material, that is doped to exhibit a first conductivity type. The photodiode may include a mesa, of a second semiconductor material, on the waveguide layer. The mesa may have a bottom surface that is over the first ion-implantation region, a top surface that is opposite the bottom surface, and a sloped sidewall between the bottom surface and the top surface. The first ion-implantation region may be set back from a section of an edge of the bottom surface of the mesa. The photodiode may include a second ion-implantation region, in the second semiconductor material, that is doped to exhibit a second conductivity type. The second ion-implantation region may extend from the top surface of the mesa, down a portion of the sloped sidewall of the mesa, and to the edge of the bottom surface of the mesa.

In some implementations, a method includes forming a waveguide layer, of a first semiconductor material, on a substrate. The method may include applying a first photoresist layer on the waveguide layer, where the first photoresist layer exposes an exposed region of the first semiconductor material. The method may include implanting a first dopant in the exposed region of the first semiconductor material to form a first ion-implantation region of a first conductivity type. The method may include forming an oxide layer, that defines an opening, on the waveguide layer. The method may include forming a mesa, of a second semiconductor material, on the waveguide layer in the opening defined in the oxide layer, where the mesa has a bottom surface that is over the first ion-implantation region, a top surface that is opposite the bottom surface, and a sloped sidewall between the bottom surface and the top surface. The method may include applying a second photoresist layer on the oxide layer and on the mesa, where the second photoresist layer defines an implantation window that exposes an exposed region of the second semiconductor material, and exposes an exposed region of the oxide layer. The method may include implanting a second dopant in the exposed region of the second semiconductor material and the exposed region of the oxide layer to form a second ion-implantation region of a second conductivity type.

DETAILED DESCRIPTION

Figure 1:
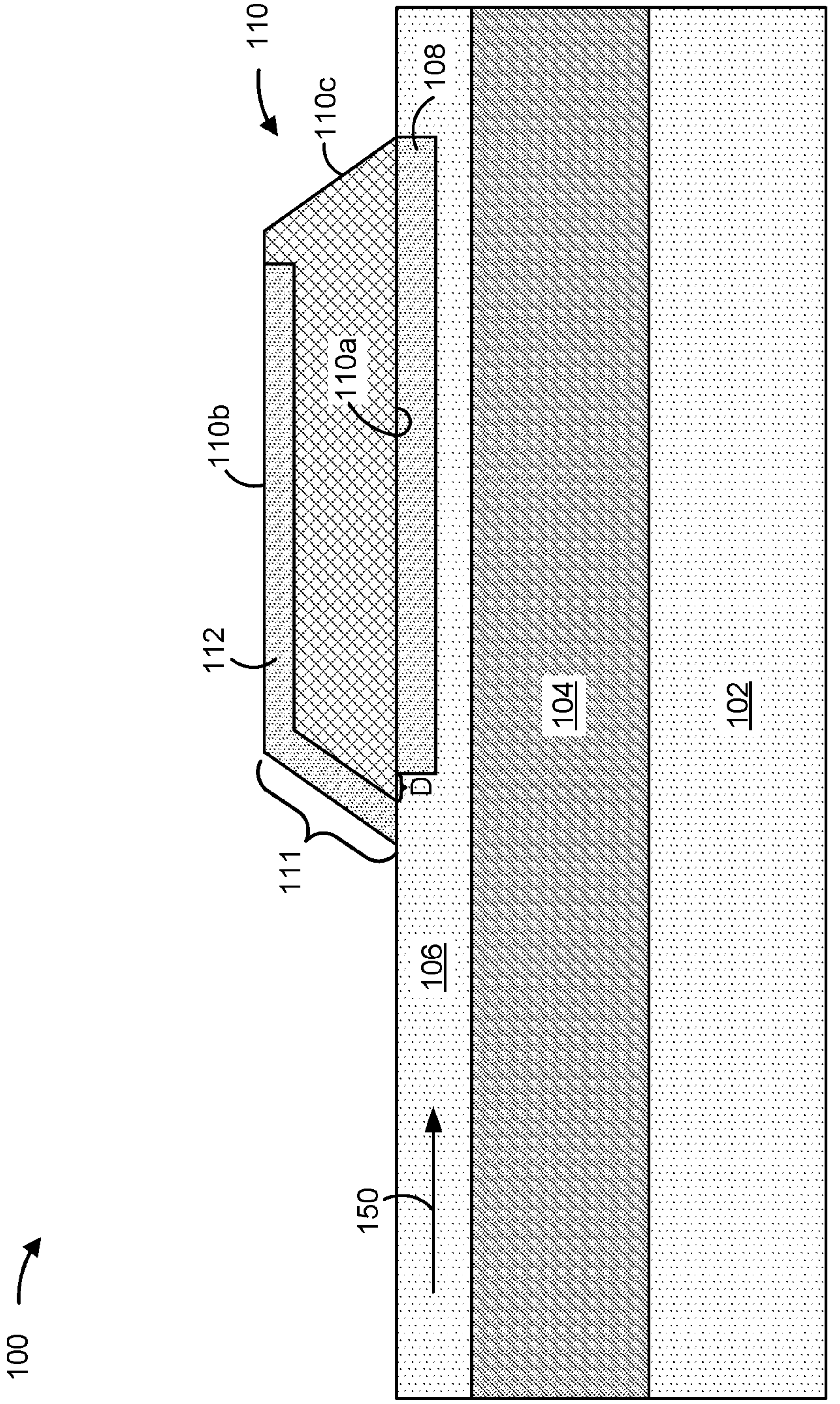
FIG. 1 is a sectional view of an example photodiode.

The following detailed description of example implementations refers to the accompanying drawings. The same reference numbers in different drawings may identify the same or similar elements.

Coherent optical communication may be used in high-speed and long-distance optical communication networks. Optical communication networks may employ photodiodes (e.g., in transceivers) for converting optical signals into electrical signals. In coherent optical communication, high optical powers may be input to photodiodes. In microscale photodiodes, high optical powers may result in high optical intensities and power saturation effects. In general, these effects can be alleviated by reducing a local optical intensity, such as by using a larger photodiode to spread out input light. As another example, a bias of a photodiode may be increased to produce a higher electric field. However, techniques to alleviate power saturation can limit other characteristics of a photodiode, such as dark current and/or an electrical bandwidth.

Furthermore, a manufacturing process for a photodiode may place tight constraints on options for introducing doping to form conductive regions of the photodiode. For example, an epitaxially grown photodiode (e.g., using selective area growth) may have a geometry that makes implanting doping to particular regions of the photodiode difficult to control. As an example, a photoresist defining an implantation window may be placed on a semiconductor region of the photodiode to control doping in the semiconductor region. However, the semiconductor region may have sloped sidewalls that affect precise control over the location of the implantation window.

Some implementations described herein provide a photodiode useful in coherent optical communication involving high optical powers. In some implementations, the photodiode may include a semiconductor mesa (e.g., a germanium mesa) having a sloped sidewall. The sloped sidewall may have an optical input portion into which signal light is guided. The mesa may be positioned on a first ion-implantation region of a first conductivity type, and a second ion-implantation region of a second conductivity type may extend down the optical input portion of the sloped sidewall in close proximity to the first ion-implantation region, thereby producing a high electric field on the optical input portion of the sloped sidewall suitable for high-power applications and achieving a high bandwidth across operating conditions. The first ion-implantation region may be set back from an edge of the mesa to prevent contact between the first ion-implantation region and the second ion-implantation region.

The second ion-implantation region may be produced by ion implantation using a photoresist. For example, after the semiconductor mesa is grown in an opening of an oxide layer, a photoresist may be applied that defines an implantation window exposing at least a portion of the mesa (e.g., that includes the optical input portion of the sidewall of the mesa) and at least a portion of the oxide layer that is adjacent to the optical input portion of the sidewall. By extending the implantation window to encompass this portion of the oxide layer, the implantation window can expose the sidewall of the mesa while at the same time an edge of the implantation window is on a flat surface of the oxide layer rather than on the sloped sidewall of the mesa. In this way, the sloped sidewall of the mesa can be fully covered by the second ion-implantation region in a consistent manner. Precise placement of the first ion-implantation region, and the second ion-implantation region fully covering the sloped sidewall of the mesa, allow the first ion-implantation region and the second ion-implantation region to be closely placed, thereby increasing the electric field at the optical input portion of the sidewall of the mesa.

FIG. 1 is a sectional view of an example photodiode 100. The photodiode 100 may be a silicon photonics device. As shown, the photodiode 100 may include a substrate 102. The substrate 102 may be a semiconductor material, such as silicon, gallium arsenide (GaAs), indium phosphide (InP), or another semiconductor material. The photodiode 100 may include on oxide layer 104 on the substrate 102. For example, the oxide layer 104 may be a buried oxide (BOX) layer formed in the substrate 102. Accordingly, a substrate of the photodiode 100 may include the substrate 102 (e.g., a semiconductor material layer) and the oxide layer 104. The photodiode 100 may include a waveguide layer 106 on the substrate 102. For example, the waveguide layer 106 may be on the oxide layer 104. The oxide layer 104 may isolate the waveguide layer 106 from the substrate 102. For example, the photodiode 100 may use a silicon-on-insulator (SOI) technology.

The waveguide layer 106 may be composed of a first semiconductor material (e.g., the same semiconductor material as the substrate 102). For example, the first semiconductor material may be silicon. The waveguide layer 106 may define an optical waveguide configured to guide signal light in a propagation direction 150 (e.g., the optical waveguide may encompass less than an entirety of the waveguide layer 106). The photodiode 100 may include a first ion-implantation region 108 in the first semiconductor material. For example, the first ion-implantation region 108 may be formed in the waveguide layer 106. The first ion-implantation region 108 may include the first semiconductor material doped (e.g., by ion implantation, as described herein) to exhibit a first conductivity type (e.g., a p-type conductivity). For example, the first ion-implantation region 108 may include p-doped silicon.

The photodiode 100 may include a mesa 110 on the waveguide layer 106 (e.g., on the first ion-implantation region 108). The mesa 110 may be composed of a second semiconductor material. For example, the second semiconductor material may be germanium. In some implementations, the second semiconductor material may be the same material as the first semiconductor material. Alternatively, the second semiconductor material may be a different material as the first semiconductor material. The mesa 110 has a bottom surface 110*a*, a top surface 110*b* opposite the bottom surface 110*a*, and a sloped sidewall 110*c* between the bottom surface 110*a* and the top surface 110*b*. The bottom surface 110*a* of the mesa 110 may be over the first ion-implantation region 108. The sidewall 110*c* may be linearly sloped or non-linearly sloped (e.g., curved). Moreover, the sidewall 110*c* may be continuously sloped, may include one or more facets, and/or may be sloped according to one or more angles. In practice, the mesa 110 may be less well-defined than shown in FIG. 1. For example, the top surface 110*b* may transition to the sidewall 110*c* more smoothly than what is shown in FIG. 1. Accordingly, the top surface 110*b* may be a substantially flat surface of the mesa 110 that is parallel to the bottom surface 110*a*, and the sidewall 110*c* may be an angled or curved surface of the mesa 110 with respect to the top surface 110*b* and the bottom surface 110*a*.

The photodiode 100 may include a second ion-implantation region 112 in the second semiconductor material. For example, the second ion-implantation region 112 may be formed in the mesa 110. The second ion-implantation region 112 may include the second semiconductor material doped (e.g., by ion implantation, as described herein) to exhibit a second conductivity type (e.g., an n-type conductivity) different from the first conductivity type of the first ion-implantation region 108. For example, the second ion-implantation region 112 may include n-doped germanium. The mesa 110 may define an intrinsic region (e.g., an intentionally undoped or lightly doped region that functions as a depletion region) between the first ion-implantation region 108 (e.g., a p-type region) and the second ion-implantation region 112 (e.g., an n-type region). For example, the photodiode 100 may have a p-i-n structure. In some implementations, the second ion-implantation region 112 may be electrically connected to a metal contact layer (e.g., to allow current to flow from the photodiode 100 to the metal contact layer).

The waveguide layer 106 may optically couple to an optical input portion 111 of the sidewall 110*c* of the mesa 110. For example, the optical input portion 111 may be a region of the sidewall 110*c* into which an optical waveguide of the waveguide layer 106 launches light into the mesa 110. The optical input portion 111 of the sidewall 110*c* of the mesa 110 may include at least one region of the mesa 110 associated with a highest optical intensity (e.g., an optical intensity that meets or exceeds a threshold). For example, the optical input portion 111 may include at least a region of the sidewall 110*c* that is coupled to an optical waveguide of the waveguide layer 106. In some implementations, the optical input portion 111 may be delineated as a quarter, a third, a half, or the like, of a total perimeter of the sidewall 110*c*. In some implementations, the optical input portion 111 may face in a direction opposite to the propagation direction 150 (e.g., the optical input portion 111 may be a forward portion of the sidewall 110*c*). In some implementations (not shown), the optical input portion 111 may face in a direction perpendicular to a propagation direction directed into the page.

The second ion-implantation region 112 may extend from the top surface 110*b* to a portion of the sidewall 110*c* of the mesa 110. For example, the second ion-implantation region 112 may encompass less than a total perimeter of the sidewall 110*c* (e.g., the second ion-implantation region 112 does not extend continuously around the sidewall 110*c*). In some implementations, the second ion-implantation region 112 may extend from the top surface 110*b* to the optical input portion 111. For example, the second ion-implantation region 112 may extend from the top surface 110*b* of the mesa 110, over an edge of the mesa 110 between the top surface 110*b* and the sidewall 110*c*, and down the optical input portion 111 of the sidewall 110*c* to fully cover the optical input portion 111 (e.g., the second ion-implantation region 112 extends fully between the top surface 110*b* and the bottom surface 110*a* at the optical input portion 111). As an example, the second ion-implantation region 112 may extend from the top surface 110*b*, down the optical input portion 111, and to an edge of the bottom surface 110*a* (e.g., at a base of the mesa 110 where the sidewall 110*c* meets the bottom surface 110*a*).

In some implementations, the second ion-implantation region 112 may extend to an additional portion of the sidewall 110*c* that is opposite the optical input portion 111 (e.g., the additional portion of the sidewall 110*c* may be a back portion of the sidewall 110*c*). For example, the second ion-implantation region 112 may extend from the optical input portion 111, across the top surface 110*b* of the mesa 110, to the additional portion of the sidewall 110*c*. The additional portion of the sidewall 110*c* may also be associated with a high optical intensity (e.g., when signal light is split and input to opposing sides of the mesa 110). In some implementations, the second ion-implantation region 112 does not extend to side portions of the sidewall 110*c* (e.g., extending between the optical input portion 111 and the additional portion). In some implementations, the second ion-implantation region 112 may be present across a section of the optical input portion 111 and a section of a side portion of the sidewall 110*c* adjacent to the optical input portion 111.

To accommodate the second ion-implantation region 112 extending down the sidewall 110*c*, the first ion implantation region 108 may have a footprint that is less than a footprint of the bottom surface 110*a*. For example, the first ion-implantation region 108 may be set back from a section of an edge of the bottom surface 110*a* (e.g., the edge to which the second ion-implantation region 112 extends), which is shown in FIG. 1 as a setback distance D.

In some implementations, an end of the first ion-implantation region 108 may extend to (or beyond) the section of the edge of the bottom surface 110*a*, and the end of first ion-implantation region 108 may define a notch that allows the first ion-implantation region 108 to be set back from the section of the edge of the bottom surface 110*a*. For example, the notch may be sized such that the first ion-implantation region 108 avoids the second ion implantation region 112. In this way, the first ion-implantation region 108 and the second ion-implantation region 112 may be positioned in close proximity to each other, but without touching. The close proximity of the first ion-implantation region 108 and the second ion-implantation region 112 may produce a strong electric field at the optical input portion 111 (e.g., where signal light is input to the photodiode 100). Accordingly, the photodiode 100 may perform well (e.g., without power saturation effects) in applications that use high optical power, such as in coherent optical communication.

As indicated above, FIG. 1 are provided as an example. Other examples may differ from what is described with regard to FIG. 1.

Figure 2:
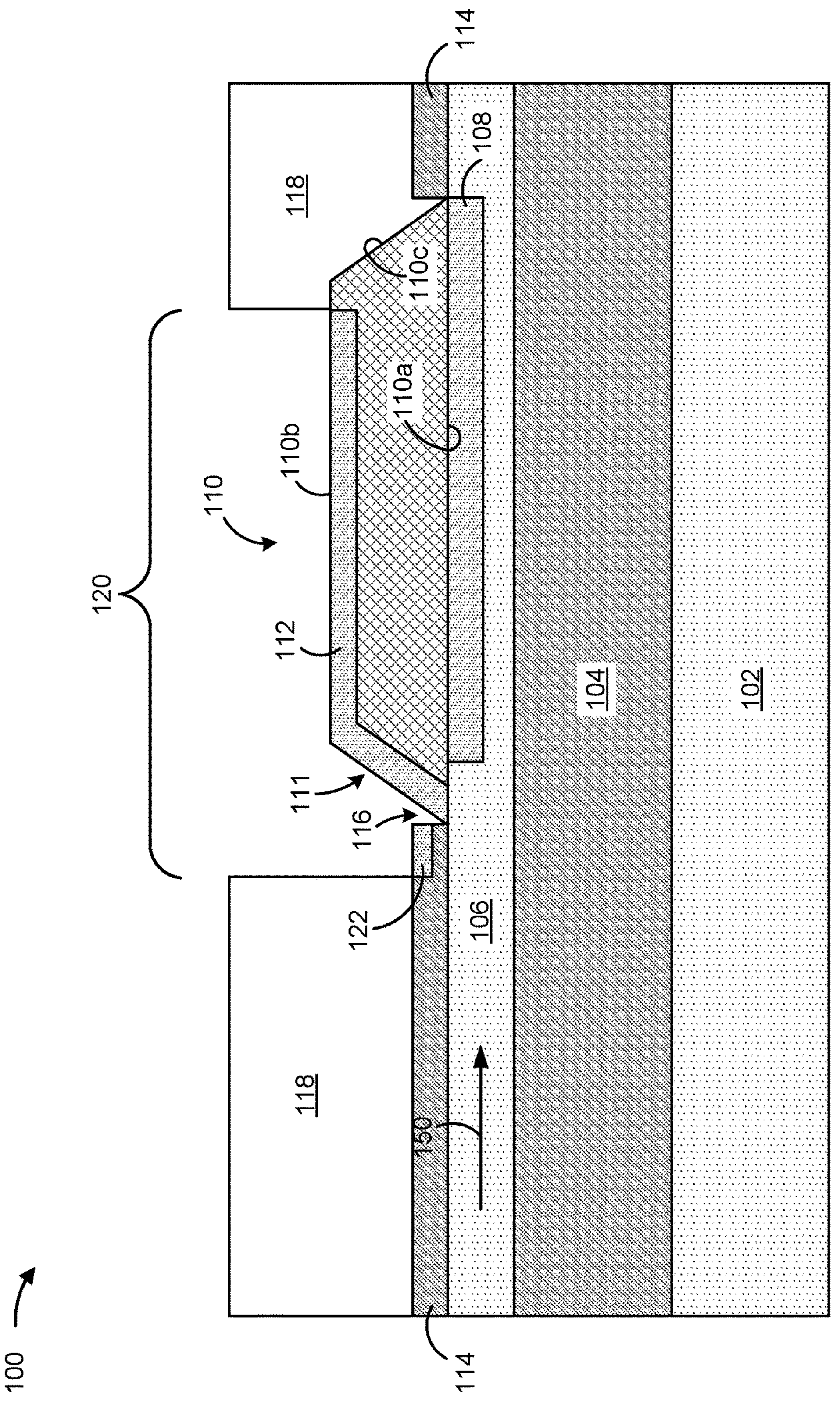
FIG. 2 is a sectional view of an example photodiode.

FIG. 2 is a sectional view of the example photodiode 100. As shown, the photodiode 100 may include an oxide layer 114. The oxide layer 114 may include a dielectric material, $SiO_2$, $Al_2O_3$, or the like. The oxide layer 114 may be on the waveguide layer 106 (and other exposed areas not covered by the waveguide layer 106), and the oxide layer 114 may define an opening 116 surrounding the mesa 110. For example, the oxide layer 114 may be deposited on the waveguide layer 106 (and other exposed areas not covered by the waveguide layer 106), and then the mesa 110 may be epitaxially grown in the opening 116. In some implementations, the oxide layer 114 may be formed as a result of wet oxidation of the first semiconductor material.

The photodiode 100 may include (e.g., during manufacture of the photodiode 100) a photoresist layer 118 on the oxide layer 114 and/or on the mesa 110. The photoresist layer 118 may define an implantation window 120 (e.g., an opening) for implantation of the second ion-implantation region 112. The implantation window 120 may be non-concentric with the mesa 110. For example, the photoresist layer 118 may cover a portion of the sidewall 110*c*, and may expose the optical input portion 111 of the sidewall 110*c*. As an example, the implantation window 120 may expose at least a portion of the top surface 110*b* of the mesa 110, expose at least a portion of the sidewall 110*c* (e.g., the optical input portion 111), and expose an ion-implantation region 122 of the oxide layer 114 that is adjacent to the optical input portion 111. The ion-implantation region 122 of the oxide layer 114 may be doped to exhibit the second conductivity type (e.g., n-type conductivity). For example, the second ion-implantation region 112 may extend (e.g., discontinuously) onto the oxide layer 114 (e.g., and the oxide layer 114 protects the implantation from doping the waveguide layer 106 beneath).

By extending the implantation window 120 to include at least a portion of the oxide layer 114, the implantation window 120 can expose the sidewall 110*c* of the mesa 110 while at the same time an edge of the implantation window 120 is on a flat surface of the photodiode 100 rather than on the sloped sidewall 110*c*. Accordingly, on the flat surface, a position of the edge of the implantation window 120 can be precisely controlled, thereby allowing the first ion-implantation region 108 and the second ion-implantation region 112 to be positioned in very close proximity without risking overlapping. Moreover, extending the implantation window 120 to include at least a portion of the oxide layer 114 ensures that the optical input portion 111 is fully doped (e.g., all the way to the base of the mesa 110 at an edge of the bottom surface 110*a*).

As indicated above, FIG. 2 are provided as an example. Other examples may differ from what is described with regard to FIG. 2.

Figure 3:
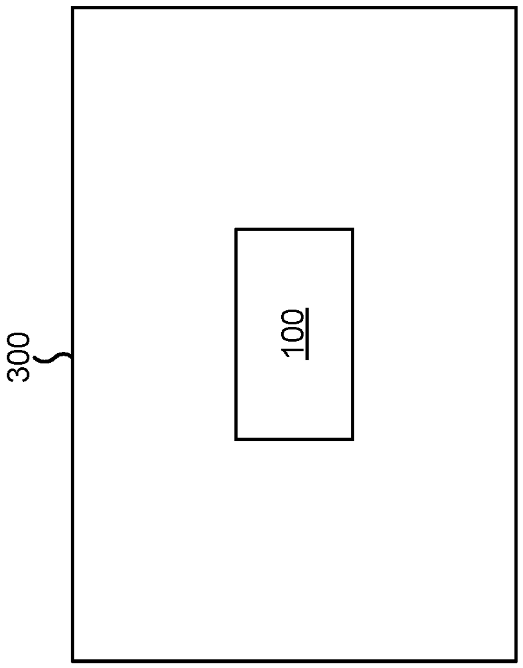
FIG. 3 is a diagram of an example system.

FIG. 3 is a diagram of an example system 300. As shown the system 300 may include the photodiode 100. In some implementations, the system 300 may include a silicon photonics device. For example, the system 300 may be a silicon photonics platform. In some implementations, the system 300 may include an optical receiver (e.g., a silicon photonics high-speed receiver). In some implementations, the photodiode 100 may be configured to provide optical power monitoring and/or the photodiode 100 may be configured to convert optical signals (e.g., received in an optical network) into electrical signals.

As indicated above, FIG. 3 are provided as an example. Other examples may differ from what is described with regard to FIG. 3.

Figure 4:
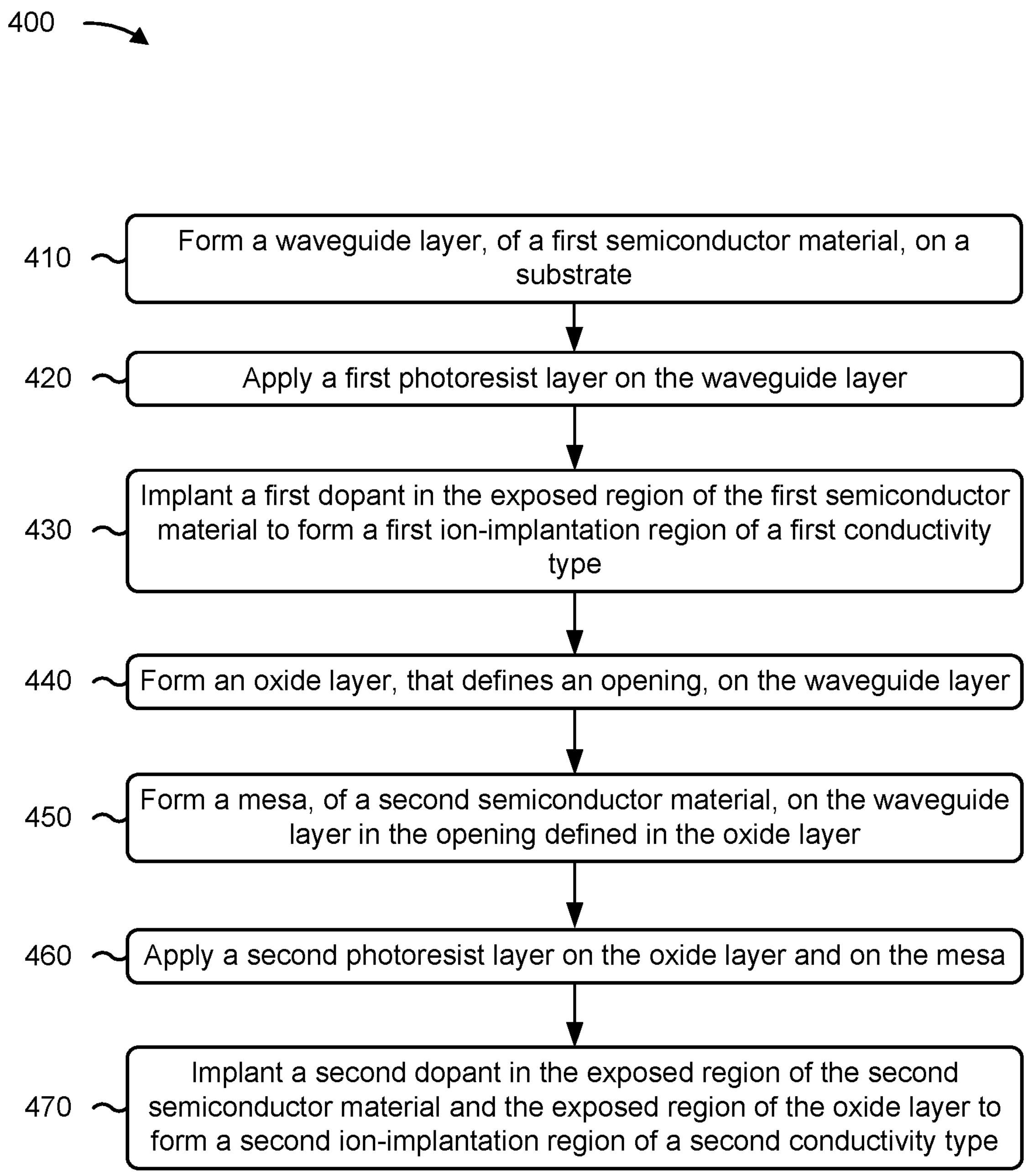
FIG. 4 is a flowchart of an example process of forming a high power photodiode.

FIG. 4 is a flowchart of an example process 400 of forming a high power photodiode. In some implementations, one or more process blocks of FIG. 4 may be performed by various semiconductor manufacturing equipment.

As shown in FIG. 4, the process 400 may include forming a waveguide layer, of a first semiconductor material, on a substrate (block 410). As further shown in FIG. 4, the process 400 may include applying a first photoresist layer on the waveguide layer (block 420). The first photoresist layer may expose an exposed region of the first semiconductor material. As further shown in FIG. 4, the process 400 may include implanting a first dopant in the exposed region of the first semiconductor material to form a first ion-implantation region of a first conductivity type (block 430). As further shown in FIG. 4, the process 400 may include forming an oxide layer, that defines an opening, on the waveguide layer (block 440).

As further shown in FIG. 4, the process 400 may include forming a mesa, of a second semiconductor material, on the waveguide layer in the opening defined in the oxide layer (block 450). The mesa has a bottom surface that is over the first ion-implantation region, a top surface that is opposite the bottom surface, and a sloped sidewall between the bottom surface and the top surface, as described herein. As further shown in FIG. 4, the process 400 may include applying a second photoresist layer on the oxide layer and on the mesa (block 460). The second photoresist layer may define an implantation window that exposes an exposed region of the second semiconductor material, and exposes an exposed region of the oxide layer, as described herein. An edge of the implantation window defined by the second photoresist layer may be on the top surface of the mesa and on the oxide layer (e.g., the edge of the implantation does not sit on the sloped sidewall of the mesa).

As further shown in FIG. 4, the process 400 may include implanting a second dopant in the exposed region of the second semiconductor material and the exposed region of the oxide layer to form a second ion-implantation region of a second conductivity type (block 470). As described herein, the second ion-implantation region may extend from the top surface of the mesa, down a portion of the sloped sidewall of the mesa, to the edge of the bottom surface of the mesa. Moreover, the first ion-implantation region may be set back from a section of the edge of the bottom surface of the mesa. As described herein, the second ion-implantation region may extend onto the oxide layer.

Although FIG. 4 shows example blocks of the process 400, in some implementations, the process 400 includes additional blocks, fewer blocks, different blocks, or differently arranged blocks than those depicted in FIG. 4. Additionally, or alternatively, two or more of the blocks of the process 400 may be performed in parallel.

In some implementations, techniques and devices described herein may be used with diodes, other than photodiodes, in high-power applications. For example, techniques and devices described herein may be used in connection with optical amplifiers (e.g., semiconductor optical amplifiers), optical modulators, or the like.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

When a component or one or more components is described or claimed (within a single claim or across multiple claims) as performing multiple operations or being configured to perform multiple operations, this language is intended to broadly cover a variety of architectures and environments. For example, unless explicitly claimed otherwise (e.g., via the use of "first component" and "second component" or other language that differentiates components in the claims), this language is intended to cover a single component performing or being configured to perform all of the operations, a group of components collectively performing or being configured to perform all of the operations, a first component performing or being configured to perform a first operation and a second component performing or being configured to perform a second operation, or any combination of components performing or being configured to perform the operations. For example, when a claim has the form "one or more components configured to: perform X; perform Y; and perform Z," that claim should be interpreted to mean "one or more components configured to perform X; one or more (possibly different) components configured to perform Y; and one or more (also possibly different) components configured to perform Z." No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "bottom," "above," "top," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A photodiode, comprising:
a waveguide layer of a first semiconductor material;
a first ion-implantation region, in the first semiconductor material, that is doped to exhibit a first conductivity type;
a mesa, of a second semiconductor material, on the waveguide layer,
wherein the mesa has a bottom surface that is over the first ion-implantation region, a top surface that is opposite the bottom surface, and a sloped sidewall between the bottom surface and the top surface,
wherein the first ion-implantation region is set back from a section of an edge of the bottom surface of the mesa, and
wherein the waveguide layer optically couples to an optical input portion of the sloped sidewall of the mesa; and
a second ion-implantation region, in the second semiconductor material, that is doped to exhibit a second conductivity type,
wherein the second ion-implantation region extends from the top surface of the mesa to the optical input portion of the sloped sidewall of the mesa.

2. The photodiode of claim 1, wherein the second ion-implantation region extends from the top surface of the mesa, down the optical input portion of the sloped sidewall of the mesa, and to the edge of the bottom surface of the mesa.

3. The photodiode of claim 1, further comprising:
an oxide layer, on the waveguide layer, that defines an opening surrounding the mesa.

4. The photodiode of claim 3, wherein the oxide layer includes an ion-implantation region that is doped to exhibit the second conductivity type.

5. The photodiode of claim 4, further comprising:
a photoresist layer defining an implantation window that exposes the ion-implantation region of the oxide layer.

6. The photodiode of claim 1, wherein the mesa defines an intrinsic region between the first ion-implantation region and the second ion-implantation region.

7. The photodiode of claim 1, further comprising a substrate that includes a semiconductor material layer and an oxide layer,
wherein the waveguide layer is disposed on the substrate.

8. The photodiode of claim 1, wherein the first semiconductor material includes silicon, and the second semiconductor material includes germanium.

9. A photodiode, comprising:
a waveguide layer of a first semiconductor material;
a first ion-implantation region, in the first semiconductor material, that is doped to exhibit a first conductivity type;
a mesa, of a second semiconductor material, on the waveguide layer,
wherein the mesa has a bottom surface that is over the first ion-implantation region, a top surface that is opposite the bottom surface, and a sloped sidewall between the bottom surface and the top surface, and
wherein the first ion-implantation region is set back from a section of an edge of the bottom surface of the mesa; and
a second ion-implantation region, in the second semiconductor material, that is doped to exhibit a second conductivity type,
wherein the second ion-implantation region extends from the top surface of the mesa, down a portion of the sloped sidewall of the mesa, and to the edge of the bottom surface of the mesa.

10. The photodiode of claim 9, further comprising:
an oxide layer, on the waveguide layer, that defines an opening surrounding the mesa.

11. The photodiode of claim 10, wherein the oxide layer includes an ion-implantation region that is doped to exhibit the second conductivity type.

12. The photodiode of claim 11, further comprising:
a photoresist layer defining an implantation window that exposes the ion-implantation region of the oxide layer.

13. The photodiode of claim 12, wherein an edge of the implantation window is on the top surface of the mesa and on the oxide layer.

14. The photodiode of claim 9, wherein the first semiconductor material includes silicon, and the second semiconductor material includes germanium.

15. The photodiode of claim 9, wherein the waveguide layer is configured to guide light in a propagation direction, and
wherein the portion of the sloped sidewall of the mesa faces in a direction opposite the propagation direction.

16. The photodiode of claim 9, wherein the waveguide layer is configured to guide light in a propagation direction, and
wherein the portion of the sloped sidewall of the mesa faces in a direction perpendicular to the propagation direction.

17. The photodiode of claim 1, wherein an end of the first ion-implantation region is configured to define a notch that causes the first ion-implantation region to be set back from the section of the edge of the bottom surface of the mesa.

18. The photodiode of claim 5, wherein the implantation window is configured to be non-concentric with the mesa.

19. The photodiode of claim 1, wherein the second ion-implantation region encompasses less than a total perimeter of the sloped sidewall.

20. The photodiode of claim 3, wherein the second ion-implantation region extends discontinuously onto the oxide layer.

* * * * *